United States Patent [19]

Seignemartin

[11] 4,209,819

[45] Jun. 24, 1980

[54] CAPACITIVE KEYSWITCH

[75] Inventor: Ewald E. Seignemartin, Spokane, Wash.

[73] Assignee: Key Tronic Corporation, Spokane, Wash.

[21] Appl. No.: 885,873

[22] Filed: Mar. 13, 1978

[51] Int. Cl.² ............................................. H01G 5/14
[52] U.S. Cl. ..................................... 361/288; 361/278
[58] Field of Search ............... 361/292, 290, 295, 278, 361/288, 400, 291; 200/DIG. 1; 340/365 C

[56] References Cited

U.S. PATENT DOCUMENTS

| | | | |
|---|---|---|---|
| 1,937,874 | 12/1933 | Debrunner | 361/278 |
| 2,494,502 | 1/1950 | Barnes | 361/290 |
| 2,541,897 | 2/1951 | Wadsworth | 361/295 |
| 2,591,644 | 4/1952 | Wadsworth | 361/295 |
| 2,747,147 | 5/1956 | Shull | 361/295 |
| 3,196,331 | 7/1965 | Blickstein | 361/292 X |
| 3,419,697 | 12/1968 | Gove . | |
| 3,548,138 | 12/1970 | Vandiane . | |
| 3,631,472 | 12/1971 | Lincoln . | |
| 3,653,038 | 3/1972 | Webb . | |
| 3,659,163 | 4/1972 | Borisov . | |
| 3,671,822 | 6/1972 | Leno | 361/288 |
| 3,679,940 | 7/1972 | Newman | 361/400 |
| 3,693,059 | 9/1972 | Harris | 361/288 |
| 3,751,612 | 8/1973 | Hansen . | |
| 3,760,243 | 4/1973 | Peroutky . | |
| 3,797,630 | 3/1972 | Webb . | |
| 3,900,712 | 8/1975 | Fukao . | |
| 3,965,399 | 6/1976 | Walker | 361/288 |
| 3,968,488 | 7/1976 | Bovio . | |

*Primary Examiner*—E. A. Goldberg
*Attorney, Agent, or Firm*—Wells, St. John & Roberts

[57] ABSTRACT

A capacitive keyswitch is described having a plunger that is movable along an axis between a released or undepressed position and a depressed position. A flexible capacitance plate is mounted on the plunger for movement therewith in a desired path. Two rigid capacitance plates are mounted with contact surfaces substantially parallel with the axis and in the path of the flexible capacitance plate for deflecting and deforming the flexible capacitance plate to the contour of the contact surfaces as the flexible capacitance plate is frictionally slid over the rigid plates.

20 Claims, 5 Drawing Figures

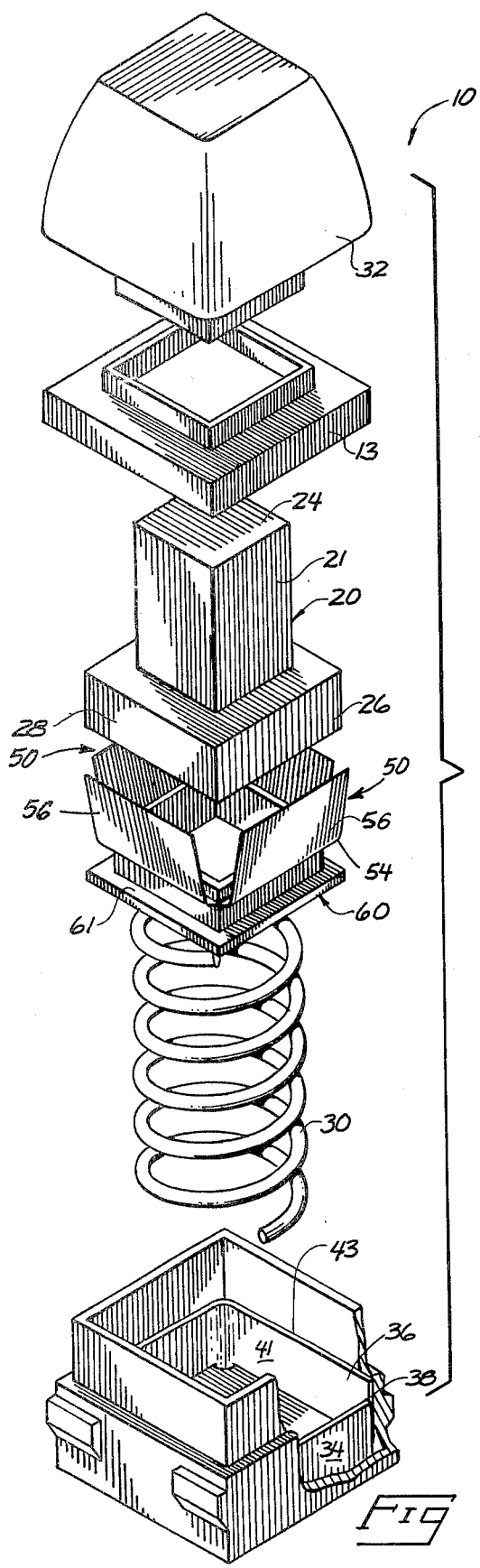
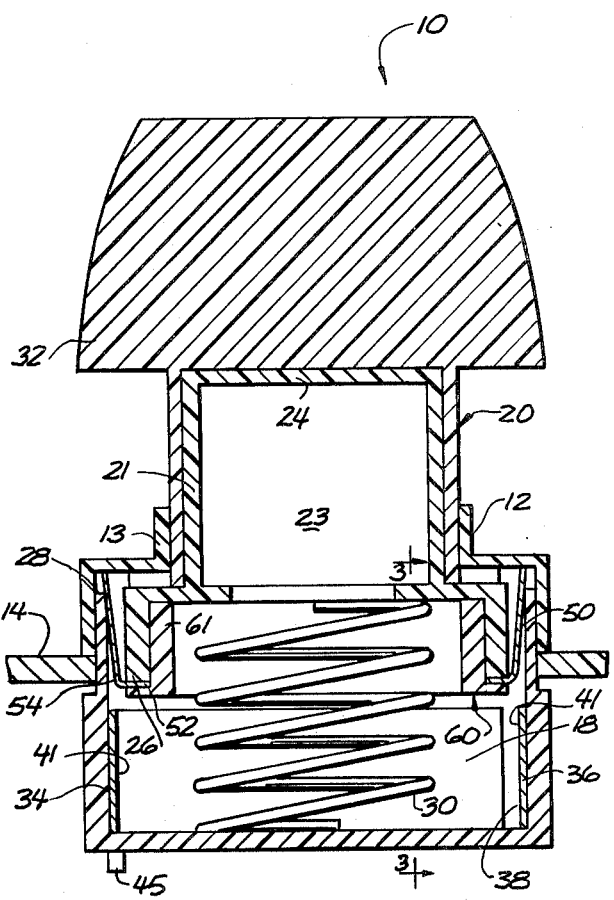
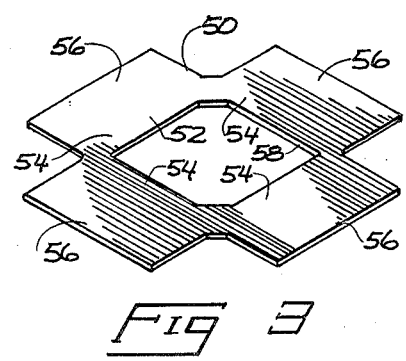

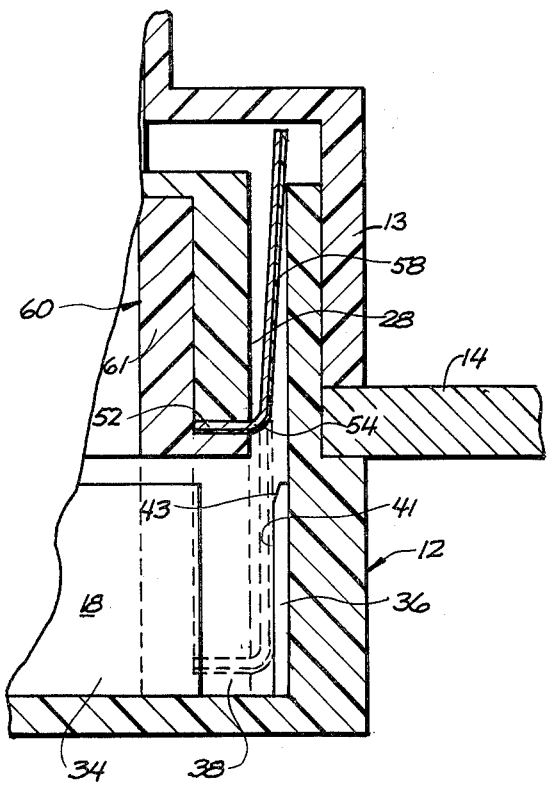
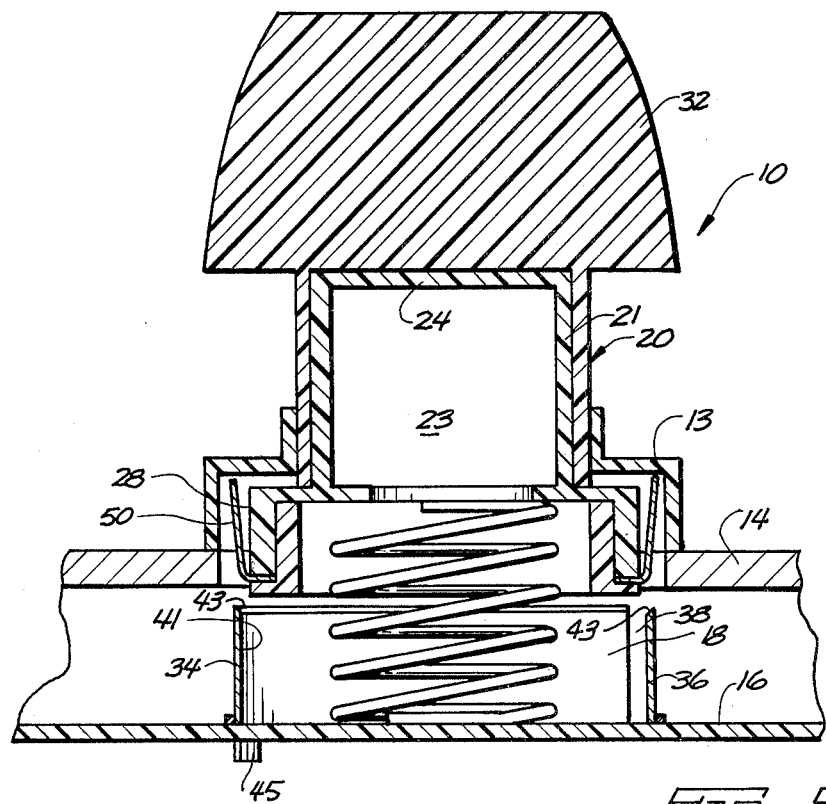

CAPACITIVE KEYSWITCH

BACKGROUND OF THE INVENTION

This invention relates to keyswitches and more particularly to keyswitches exhibiting a variable capacitance. Keyswitches are used in a wide variety of applications in the prior art, such as control circuits, keyboards for typewriters, calculators, computers and the like. The switches generally are classified according to the phenomenon relied upon to indicate activations—resistive, inductive, magnetic or capacitive.

Although capacitive keyswitches known in the prior art are somewhat simple in construction and immune to many of the problems of the contact and inductive switches, capacitive key switches of the prior art do not generally have a large variation (one order of magnitude or greater) in capacitance upon actuation. Furthermore, the capacitance type keyswitches of the prior art are particularly susceptible to environmental contamination from small particles such as eraser particles, lint and liquid spillage. Also, the capacitive keyswitches of the prior art generally have a low hysteresis and are quite sensitive to small changes in movement of the switch plunger.

One of the principal objects of this invention is to provide a reliable capacitive keyswitch that is self-cleaning and exhibits a linear capacitance change of a substantial magnitude.

An additional object is to provide such a capacitive keyswitch that additionally has a substantial capacitance hysteresis to enable the threshold values to be adjusted depending on the desired application.

A further object of this invention is to provide a new capacitive keyswitch that, in addition to the other advantages, has sufficient economy of space to easily accommodate lamps and tactile feel features.

These and other objects and advantages of this invention will become apparent upon reading the following detailed description of a preferred embodiment. Only the claims at the conclusion of the specification are intended to limit the scope of this invention.

BRIEF DESCRIPTION OF THE DRAWINGS

A preferred and alternate embodiment of this invention is illustrated in the accompanying drawings, in which:

FIG. 1 is an expanded isometric view of a keyswitch illustrating the various components of a preferred embodiment of the present invention;

FIG. 2 is a vertical cross-sectional view showing the keyswitch mounted on a keyswitch panel with a plunger in the undepressed position;

FIG. 3 is a plan view of a flexible capacitance plate of a preferred embodiment of the invention;

FIG. 4 is an enlarged fragmentary view of a portion of the switch illustrated in FIG. 2 taken along line 3—3 in FIG. 2 showing the switch in solid line in an undepressed position and in dotted line in a depressed position; and FIG. 5 illustrates a vertical cross-sectional view of an alternate embodiment of the keyswitch in which the keyswitch is utilized in conjunction with a printed circuit board in which portions of the keyswitch are mounted on the printed circuit board.

DETAILED DESCRIPTION OF PREFERRED AND ALTERNATE EMBODIMENTS

A preferred and alternate embodiment of the invention is illustrated in the attached drawings in which the pushbutton switch or keyswitch is generally designated with the numeral 10. The keyswitch 10 is intended to be connected to an electrical circuit that senses capacitance change between two switch positions.

The keyswitch 10 includes a housing 12 having a housing top 13 that is mounted in a keyboard panel, switch panel or mounting plate 14 (FIG. 2, 4, 5) depending upon the particular application of the switch 10. In the alternate embodiment illustrated in FIG. 5, the keyswitch 10 is used in conjunction with a printed circuit board 16 in which major components of the keyswitch are mounted on the printed circuit board 16 itself. The embodiment illustrated in FIGS. 1–4 shows a unitary housing 12 that is supported on mounting plate 14.

The housing 12 has a switch cavity 18 formed therein. The keyswitch 10 has a switch actuating means generally designated with the numeral 20 which preferably includes a reciprocating plunger 21 that is mounted for movement along a plunger axis between a released or undepressed position (FIG. 2) and a depressed or actuated position illustrated in dotted lines in FIG. 4. The plunger 21 is elongated having an internal hollow cavity 23 that extends from an upper end 24 to a lower end 26. Preferably the plunger has a rectangular cross section and fits within a rectangular guide surface in the housing 12. The lower end 26 of the plunger 21 has a periphery 28 that is preferably rectangular.

The keyswitch has a biasing means 30 for biasing the plunger to the released or undepressed position illustrated in solid line in FIGS. 1–5. Various types of biasing means may be utilized. A coil spring is illustrated as one possible means. It should be noted that the interior of the switch cavity 18 and the lower portion of the plunger 21 are quite spacious and unobstructed and thus can accommodate various types of tactile feel systems and/or lamp or illumination features. At upper end 24 of the plunger, a push button or keytop 32 is provided to assist in the manual actuation of the switch.

One of the principal features of the illustrated preferred and alternate embodiment includes stationary, rigid capacitance plates 34 and 36. In the preferred embodiment, the rigid capacitance plates 34 and 36 are mounted against a wall of the switch cavity 18. The plates 34 and 36 are mounted in an upright orientation substantially parallel with the plunger axis. The plates 34 and 36 are mounted in close proximity to the path of the plunger without interfering with the movement of the plunger. The plates 34 and 36 are separated by a capacitance gap 38. In a preferred embodiment the gap 38 is important to defining the capacitance value between the two plates 34 and 36 when the switch is in the released up or depressed position.

Each of the plates 34 and 36 are preferably of a rigid structure and include a planar face surface 41 that is substantially parallel with the plunger axis. The plates 34 and 36 preferably have an upper inclined edge 43 (FIG. 5). The plates 34 and 36 have terminals 45 for use in conveniently connecting the plates to an electrical circuit. In a preferred embodiment, the electrical circuit is operatively connected to the plates 34 and 36 to measure or sense the capacitance therebetween.

An additional important feature of the illustrated preferred and alternate embodiment is a flexible capacitance plate 50 that is utilized to capacitively couple the plates 34 and 36 together and to bridge the gap 38 to cause a substantial change in the capacitance as measured by the electrical circuit. The flexible capacitance plate 50 is preferably formed of a thin sheet material that may be readily deformed when engaged by the plates 34 and 36. The flexible capacitance plate 50, in the illustrated preferred and alternate embodiment has a mounting portion 52 (FIG. 3) that is utilized for securing the plate 50 to the plunger end 24. The plate 50 includes a bending portion 54 that initially extends radially outward beyond the periphery 28 of the plunger 21. The bending portion 54 extends integrally into contact portions 56 that extend outward in a cantilevered manner from the plunger for engaging and slidably functionally wiping the planar face surfaces 41 of the plates 34 and 36. The flexible capacitive plate 50 is sufficiently flexible to enable the bending portions 54 to readily bend to cause the contact portions 56 to conform to the contour and orientation of the planar surfaces 41. The natural resilience of the sheet material biases the contact portions 56 outward to form an intimate frictional contact with the planar surfaces 41.

In a preferred embodiment as illustrated in FIG. 3, the capacitive plate 50 has a central mounting aperture 58 formed therein. Keyswitch 10 has a mounting means 60 with a flanged insert portion 61 to enable the mounting means to be press fit into the lower end 26 to secure the plate 50 to the plunger 21.

In the preferred embodiment, the plates 34 and 36 are formed into a square or rectangular configuration with the plates 34 and 36 being substantially perpendicular to each other across the gap 38. The plate 50 is formed in the shape of a "four leaf clover" with four contact portions 56 projecting outward at 90° intervals about the axis.

The flexible capacitance plate 50 is constructed from a thin sheet of metalized dielectric material having a thickness less than 0.06 milimeters and preferably having a thickness less than 0.03 milimeters. Satisfactory commercially available metalized dielectric material includes aluminized "Mylar". The flexible capacitance plate preferably includes a flexible dielectric plastic backing having a metalized layer of a few thousand Angstroms deposited thereon.

In a preferred embodiment, the capacitance plates 34 and 36 are formed of a highly electrically conductive material such as aluminum or copper. In an alternate embodiment the plates 34 and 36 may be coated with a thin dielectric material with the flexible capacitance plate 50 being formed of a thin metal foil. The term "capacitance plate" is used broadly and may include a separate metal plate or layer or it may include a metal plate that is coated with a dielectric layer or a metal layer on a dielectric backing as long as the plates when in contact with each other have a dielectric layer separating the metal layers.

In alternate embodiments, the stationary plates 34 and 36 may be formed of flexible sheet material with plates 50 and 34, 36 deforming in a sliding frictional arrangement to each other's contours. Furthermore, in an alternate embodiment, the location of plates 34, 36 and plate 50 may be reversed with the plates 34 and 36 being mounted on the plunger and the flexible plate 50 being stationarily positioned in the path of a rigid plate 34, 36. Furthermore, in alternate embodiments, the stationary plates 34 and 36 may be elevated so that the flexible capacitance plate 50 engages the plates 34 and 36 when the plunger is in the released or depressed position with the plunger moving the flexible capacitance plate 50 downward away from the plates 34 and 36 when the plunger is depressed. The important aspect is to obtain a substantial change in the capacitance as sensed by the electrical circuit when the plunger moves from one position to the other position.

It should be noted that the arrangement is self-cleaning with the flexible capacitance plate 50 frictionally sliding over the surfaces 41 of the capacitance plates 34, 36 to wipe the surfaces to remove any particle or contaminations therefrom. Furthermore, the capacitance as measured by the electrical circuit changes substantially linear with the movement of the plunger. In experimental models, capacitance changes of greater than seven to one have been obtained. Furthermore, because of the linear nature of the changing capacitance, the circuit provides for a substantial hysteresis in which the threshold points may be easily adjusted to eliminate the problem of ripple movement or "teasing" of the plunger. Furthermore, it should be appreciated that a very intimate contact is produced between the flexible capacitance plate 50 and the rigid capacitance plates 34, 36 because of their sliding frictional contact and the natural resilient pressure of the flexible material against the rigid plates during the wiping action. Furthermore, the alignment tolerances of the plunger with respect to the stationary rigid capacitance plates 34, 36 may be quite large because of the substantially self-centering or aligning capability of the flexible capacitance plate 50 as it moves over the stationary rigid capacitance plates 34 and 36. The flexible capacitance plate 50 in essence is biased outwardly to provide a pressure against the stationary plates 34 and 36.

All of these features provide for a keyswitch that is economical to manufacture, capable of operating in contaminate environments and having unusually good electrical characteristics.

It should be understood that the above described embodiments are simply illustrative of the principles of this invention and numerous other embodiments may be readily devised without deviating therefrom. Therefore, only the following claims are intended to define the scope of this invention.

What is claimed is:

1. A capacitance keyswitch having the components thereof arranged along a reference axis, comprising:
   a first capacitance plate;
   first support means mounting the first capacitance plate substantially parallel with the reference axis;
   a second capacitance plate;
   second support means mounting the second capacitance plate;
   at least one of said capacitance plates comprising a resilient flexible sheet extended radially to one side of the reference axis in a cantilevered manner from a plane intersecting the reference axis across the support means on which it is mounted;
   said first and second support means being movably mounted to one another for reciprocating movement relative to one another in directions parallel to said reference axis between an undepressed position and a depressed position to enable the flexible sheet to progressively bend in response to such reciprocating movement and to frictionally slide in surface-to-surface contact over the remaining capacitance plate, the resilience of said flexible sheet serving to bias it radially outward from the reference axis to provide wiping pressure against the remaining capacitance plate that deforms the flexible sheet to the remaining capacitance plate and insures intimate contact therebetween to effect changes in the capacitance between the capacitance plates in response to such reciprocating movement;

and yieldable biasing means operably mounted between said first and second support means for urging them to the undepressed position.

2. The capacitance keyswitch as set out in claim 1 wherein said first capacitance plate is stationary and said second capacitance plate is movable along said reference axis.

3. The capacitance keyswitch as set out in claim 1 wherein the reference axis is vertical.

4. The capacitance keyswitch as set out in claim 1 wherein the reference axis is vertical;

said first capacitance plate being stationary and having an upright orientation;

said second capacitance plate comprising a flexible sheet extended radially in a cantilevered manner from the support means on which it is mounted; and said first capacitance plate having a rigid planar face surface substantially parallel to the reference axis.

5. A capacitance keyswitch having the components thereof arranged along an upright axis, comprising:

a stationary capacitance plate;

first support means mounting the stationary capacitance plate substantially parallel with the upright axis;

a movable capacitance plate;

second support means mounting the movable capacitance plate;

at least one of said capacitance plates comprising a resilient flexible sheet extended radially to one side of the upright axis in a cantilevered manner from a plane intersecting the upright axis across the support means on which it is mounted;

said second support means being movably mounted to said first support means for reciprocating movement relative to said first support means between an undepressed position and a depressed position in directions parallel to said upright axis to enable the flexible sheet to progressively bend in response to such reciprocating movement and to frictionally slide in surface-to-surface contact over the remaining capacitance plate, the resilience of said flexible sheet serving to bias it radially outward from the reference axis to provide wiping pressure against the remaining capacitance plate that deforms the flexible sheet to the remaining capacitance plate and insures intimate contact therebetween to effect changes in the capacitance between the capacitance plates in response to such reciprocating movement;

and yieldable biasing means operably mounted between said first and second support means for urging said second support means to the undepressed position.

6. The capacitance keyswitch as defined in claim 5 wherein the reference axis is vertical;

said stationary capacitance plate having a rigid planar face surface mounted to said first support means in an upright orientation.

7. The capacitance keyswitch as defined in claim 5, further comprising:

a second stationary capacitance plate spaced from said first-named stationary capacitance plate;

said movable capacitance plate being mounted to said second support means to capacitively couple the stationary capacitance plates and change the capacitance between them in response to reciprocating movement of said first and second support means relative to one another.

8. The capacitance keyswitch as defined in claim 7 wherein said first support means comprises a fixed base mounting both stationary capacitance plates in upright orientation; and said second support means comprises a plunger slidably mounted to said fixed base for movement along said upright axis;

whereby movement of said plunger along said upright axis causes the movable capacitance plate to frictionally slide in surface-to-surface contact over both upright stationary plates.

9. The capacitance keyswitch as defined in claim 7 wherein the stationary capacitance plates are formed in intersecting planes and have a gap between them where their respective planes intersect.

10. A capacitance keyswitch having the components thereof arranged along an upright axis, comprising:

first and second support means centered along said upright axis and movably mounted to one another for reciprocating movement relative to one another in directions parallel to said upright axis between an undepressed position and a depressed position;

a rigid capacitance plate fixed to said first support means, said rigid capacitance plate having a planar face surface offset to one side of the upright axis and substantially parallel thereto;

a flexible capacitance plate comprising a resilient flexible sheet mounted to said second support means; said flexible sheet being extended radially to one side of the upright axis in a cantilevered manner from a plane intersecting the upright axis across the second support means;

whereby the flexible sheet progressively bends in responde to reciprocating movement between the first and second support means and frictionally slides over the face surface of said rigid capacitance plate, the resilience of said flexible sheet serving to bias it radially outward from the upright axis to provide wiping pressure against the rigid capacitance plate that deforms the flexible sheet to its face surface and insures intimate contact therebetween to effect changes in the capacitance between the capacitance plates in response to such reciprocating movement;

and yieldable biasing means operably mounted between said first and second support means for urging them to the undepressed position.

11. A capacitance keyswitch as defined in claim 10 wherein said rigid capacitance plate includes two planar face surfaces offset to the side of the upright axis and having a gap between them;

said flexible capacitance plate comprising a unitary sheet bridging both planar face surfaces of the rigid capacitance plates to thereby change the capacitance between them in response to reciprocating movement of said first and second support means relative to one another.

12. A capacitance keyswitch as defined in claim 10 wherein said rigid capacitance plate includes two planar face surfaces formed in intersecting planes and having a gap between them where their respective planes intersect;

said flexible capacitance plate comprising a unitary sheet bridging both planar face surfaces to thereby change the capacitance between them in response to reciprocating movement of said first and second support means relative to one another.

13. A capacitance keyswitch having the components thereof arranged about a central upright axis, comprising:

a supporting stationary housing;

a plunger centered along the upright axis and movably mounted on said housing for reciprocating movement parallel to the axis between an undepressed position and a depressed position;

a pair of upright capacitance plates on said housing having planar inner surfaces in close proximity to the path of the plunger, said capacitance plates being physically separated by a capacitance gap;

a movable capacitance plate comprising a resilient flexible sheet mounted to said plunger and extended to the side of the upright axis in a cantilevered manner from a plane intersecting the upright axis;

said movable plate having contact portions extending beyond the planes of the inner surfaces on the pair of upright capacitance plates when the plunger is in its undepressed position and being capable of progressively bending in response to subsequent movement of the plunger to its depressed position to frictionally slide in surface-to-surface contact over the inner surfaces of the pair of upright capacitance plates to effect changes in the capacitance between them in response to such movement;

and yieldable biasing means operably mounted between said housing and said plunger for urging said plunger to the undepressed position.

14. The capacitance keyswitch as defined in claim 13 wherein the pair of upright capacitance plates each have upper inclined edges formed across them leading upwardly and outwardly from their respective inner surfaces.

15. The capacitance keyswitch as defined in claim 13 wherein the sheet comprising the movable capacitance plate further includes:

a mounting portion fixed to the plunger;

a bending portion that initially extends radially outward beyond the periphery of the plunger from the mounting portion thereof;

said bending portion extending integrally into the contact portions that extend outward in a cantilevered manner from the plunger for engaging and slidably functionally wiping the inner surfaces of the pair of upright capacitance plates.

16. The capacitance keyswitch as defined in claim 13 wherein the movable capacitance plate comprises a thin, flexible metalized dielectric sheet material whose natural resilience biases the contact portions thereof outward from the plunger for intimate frictional contact with the planar inner surfaces of the pair of upright capacitance plates.

17. The capacitance keyswitch as defined in claim 13 wherein the movable capacitance plate comprises a thin layer of conductive metal supported on a flexible dielectric backing sheet having a thickness of less than 0.03 millimeters.

18. The capacitance keyswitch as defined in claim 13 wherein the plunger has a rectangular cross section and is slidably guided by rectangular guide surfaces formed on said housing.

19. The capacitance keyswitch as defined in claim 18 wherein the pair of upright capacitance plates are located on said housing perpendicular to one another, said wherein the movable capacitance plate is in the form of an integral sheet having a mounting portion fixed to the plunger and two radial projections perpendicular to one another and overlying the respective upright capacitance plates.

20. The capacitance keyswitch as defined in claim 18 wherein the pair of upright capacitance plates each include perpendicular inner surfaces leading to outer upright edges, the plates being physically separated from one another along their outer upright edges, and wherein the movable capacitance plate is in the form of an integral sheet having a central mounting portion and four contact portions projecting outward therefrom at perpendicular intervals about the upright axis.

* * * * *